United States Patent
Sim

(10) Patent No.: US 12,065,997 B2
(45) Date of Patent: Aug. 20, 2024

(54) IGNITION COIL CONTROL SYSTEM AND METHOD

(71) Applicants: HYUNDAI MOTOR COMPANY, Seoul (KR); KIA CORPORATION, Seoul (KR)

(72) Inventor: Kiseon Sim, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 275 days.

(21) Appl. No.: 17/844,428

(22) Filed: Jun. 20, 2022

(65) Prior Publication Data

US 2023/0035555 A1 Feb. 2, 2023

(30) Foreign Application Priority Data

Jul. 28, 2021 (KR) .................. 10-2021-0099175

(51) Int. Cl.
- *F02P 3/045* (2006.01)
- *H01F 38/12* (2006.01)
- *H03K 3/017* (2006.01)

(52) U.S. Cl.
CPC ............ *F02P 3/0453* (2013.01); *H01F 38/12* (2013.01); *H03K 3/017* (2013.01)

(58) Field of Classification Search
CPC ........ F02P 3/0453; F02P 3/0435; F02P 3/051; F02P 15/08; F02P 17/12; H01F 38/01; H01F 27/402; H03K 3/017; H01T 15/00
See application file for complete search history.

(56) References Cited

U.S. PATENT DOCUMENTS

| | | | | |
|---|---|---|---|---|
| 9,429,134 B2* | 8/2016 | Desai | ............ | F02P 9/007 |
| 10,006,432 B2 | 6/2018 | Desai et al. | | |
| 11,199,170 B2* | 12/2021 | Funato | ........... | F02P 17/12 |
| 11,378,055 B1* | 7/2022 | Sim | ........... | F02P 3/02 |
| 11,795,899 B1* | 10/2023 | Sim | ........... | F02P 3/045 |
| 11,879,420 B1* | 1/2024 | Sim | ........... | F02P 3/045 |
| 2013/0241429 A1* | 9/2013 | Ruan | ........... | F02P 3/0456 |
| | | | | 315/213 |
| 2014/0102412 A1* | 4/2014 | Czekala | ........... | F02P 3/045 |
| | | | | 123/406.12 |
| 2018/0258901 A1* | 9/2018 | Terada | ........... | F02P 3/04 |
| 2022/0252033 A1* | 8/2022 | Sim | ........... | F02P 3/0456 |
| 2022/0275782 A1* | 9/2022 | Sim | ........... | F02P 3/05 |
| 2022/0285921 A1* | 9/2022 | Sim | ........... | F02P 15/10 |
| 2022/0364537 A1* | 11/2022 | Sim | ........... | F02P 3/051 |
| 2023/0029000 A1* | 1/2023 | Sim | ........... | G01R 19/16533 |

(Continued)

*Primary Examiner* — Phutthiwat Wongwian
*Assistant Examiner* — Arnold Castro
(74) *Attorney, Agent, or Firm* — Lempia Summerfield Katz LLC

(57) ABSTRACT

An ignition coil control system includes: a plurality of ignition coils that respectively include a primary coil and a secondary coil; a spark plug that generates a spark discharge by a discharge current generated by the plurality of ignition coils and that includes a center electrode and a ground electrode; a sensing part measuring a current applied to the primary coil; and an ignition controller that adjusts a reference duty signal based on an amount of the current applied to the primary coil sensed by the sensing part to adjust discharge energy generated between the center electrode and the ground electrode through the secondary coil.

12 Claims, 7 Drawing Sheets

(56) References Cited

U.S. PATENT DOCUMENTS

2023/0070763 A1\* 3/2023 Woo .................. F02P 3/04
2023/0109264 A1\* 4/2023 Sim .................. F02P 15/08
                                              315/226

\* cited by examiner

IGNITION COIL CONTROL SYSTEM AND METHOD

CROSS-REFERENCE TO RELATED APPLICATION

This application claims priority to and the benefit of Korean Patent Application No. 10-2021-0099175 filed in the Korean Intellectual Property Office on Jul. 28, 2021, the entire contents of which are incorporated herein by reference.

BACKGROUND

(a) Field of the Disclosure

The present disclosure relates to an ignition coil control system and method, and more particularly, to an ignition coil control system and method that may control discharge energy through a current supplied to a primary coil of an ignition coil.

(b) Description of the Related Art

In gasoline vehicles, a mixture of air and fuel to be combusted is ignited by a spark generated by a spark plug. In other words, the air-fuel mixture injected into a combustion chamber during a compression stroke is ignited by a discharge phenomenon of the spark plug. Thus, energy required for driving a vehicle is generated while the air-fuel mixture is undergoing a high temperature and high pressure expansion process.

The spark plug provided in the gasoline vehicle serves to ignite a compressed air-fuel mixture by spark discharge caused by a high voltage current generated by an ignition coil.

In a conventional spark plug, a high voltage current (or a discharge current) is generated in a secondary coil due to electromagnetic induction of a current applied to a primary coil. Thus, spark discharge occurs between a center electrode and a ground electrode.

However, depending on a flow of air and/or fuel in an operation area of an engine or inside a combustion chamber, arc resistance inside the combustion chamber is changed, which causes the discharge current generated in the secondary coil to be changed, thus discharge energy may be changed.

For example, when the flow inside the combustion chamber is strong (e.g., fast, turbulent), the arc resistance around the electrode of the spark plug increases because flow around the electrode of the spark plug is also strong. Accordingly, the discharge energy generated in the secondary coil of the ignition coil is relatively reduced.

Conversely, when the flow inside the combustion chamber is weak (e.g., slow, calm), the arc resistance around the electrode of the spark plug decreases because flow around the electrode of the spark plug is also weak. Accordingly, the discharge energy generated in the secondary coil of the ignition coil is relatively increased.

In other words, there is a problem that the discharge energy by the spark plug varies according to the flow state inside the combustion chamber.

The above information disclosed in this Background section is only to enhance understanding of the background of the disclosure. Therefore, the Background section may contain information that does not form the prior art that is already known in this country to a person of ordinary skill in the art.

SUMMARY

The present disclosure has been made in an effort to provide an ignition coil control system and method that may adjust discharge energy of a spark plug according to a flow state inside a combustion chamber.

An embodiment of the present disclosure provides an ignition coil control system including: a plurality of ignition coils that respectively include a primary coil and a secondary coil; a spark plug that generates a spark discharge by a discharge current generated by the plurality of ignition coils and includes a center electrode and a ground electrode; a sensing part measuring a current applied to the primary coil; and an ignition controller that adjusts a reference duty signal based on an amount of the current applied to the primary coil sensed by the sensing part to adjust discharge energy generated between the center electrode and the ground electrode through the secondary coil.

The reference duty signal may include a plurality of pulse signals. The ignition controller may decrease a period of the plurality of pulse signals when the current applied to the primary coil exceeds a maximum threshold value.

The reference duty signal may include a plurality of pulse signals. The ignition controller may increase a period of the plurality of pulse signals when the current applied to the primary coil is less than a minimum threshold value.

The sensing part may directly measure the current applied to the primary coil.

The sensing part may calculate the current of the primary coil through a resistance value of a resistor electrically connected in series to the primary coil and a voltage applied to the resistor.

The plurality of ignition coils may be two ignition coils that respectively supply a current to the center electrode and the ground electrode. The ignition controller may apply the reference duty signal to each of the primary coils of the two ignition coils to perform multi-stage ignition.

The reference duty signal applied to each of the primary coils of the two ignition coils may be delayed for a set delay time.

Another embodiment of the present disclosure provides an ignition coil control method in which a spark plug is included. The spark plug generates spark discharge by a discharge current generated by a plurality of ignition coils respectively including a primary coil and a secondary coil and includes a center electrode and a ground electrode. The ignition coil control method includes measuring a current applied to the primary coil and adjusting a reference duty signal based on an amount of the current applied to the primary coil to adjust discharge energy generated between the center electrode and the ground electrode through the secondary coil.

When the current applied to the primary coil exceeds a maximum threshold value, a ratio of the reference duty signal may be decreased. The reference duty signal may include a plurality of pulse signals and the ratio may be a period of the pulse signals.

When the current applied to the primary coil is less than a minimum threshold value, a ratio of the reference duty signal may be increased. The reference duty signal may include a plurality of pulse signals and the ratio may be a period of the pulse signals.

The ignition coil may be two ignition coils that respectively supply a current to the center electrode and the ground electrode. The ignition controller may apply the reference duty signal to each of the primary coils of the two ignition coils to perform multi-stage ignition.

The reference duty signal applied to each of the primary coils of the two ignition coils may be delayed for a set delay time.

According to the ignition coil control system and method according to embodiments of the present disclosure as described above, it is possible to supply appropriate ignition energy into a combustion chamber by predicting a flow or pressure state inside the combustion chamber.

BRIEF DESCRIPTION OF THE DRAWINGS

The drawings are for reference only in describing embodiments of the present disclosure. Therefore, the technical idea of the present disclosure should not be limited to the accompanying drawings.

DETAILED DESCRIPTION OF THE EMBODIMENTS

Figure 1:
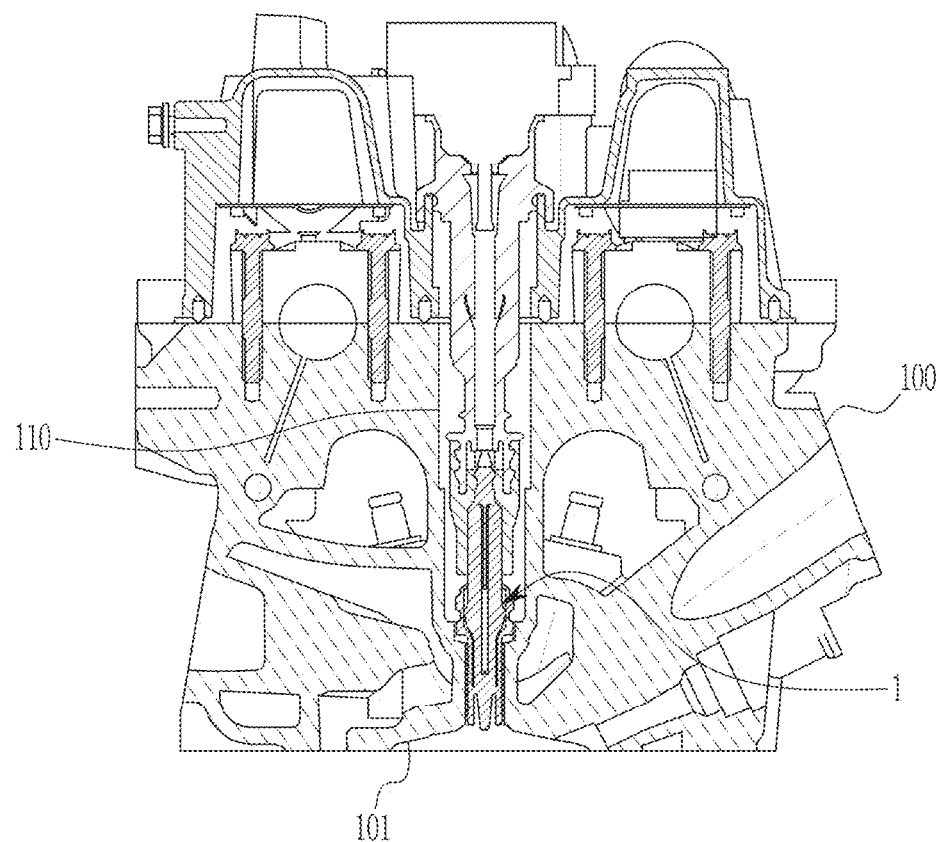
FIG. 1 illustrates a cross-sectional view of an engine in which a spark plug is installed according to an embodiment of the present disclosure.

The present inventive concept is described more fully hereinafter with reference to the accompanying drawings, in which embodiments of the disclosure are shown. As those of ordinary skill in the art should realize, the described embodiments may be modified in various different ways, all without departing from the spirit or scope of the present inventive concept.

In order to clearly describe the present disclosure, parts that are irrelevant to the description have been omitted. Also, identical or similar constituent elements throughout the specification are denoted by the same reference numerals.

In addition, since the size and thickness of each configuration shown in the drawings are arbitrarily shown for convenience of description, the present disclosure is not necessarily limited to configurations illustrated in the drawings. In order to clearly illustrate several parts and areas, enlarged thicknesses may be shown.

Hereinafter, a control system of an ignition coil according to an embodiment of the present disclosure is described in detail with reference to the accompanying drawings.

FIG. 1 illustrates a cross-sectional view of an engine in which a spark plug is installed according to an embodiment of the present disclosure.

As shown in FIG. 1, a spark plug 1 according to an embodiment of the present disclosure is installed in a combustion chamber 101 of an engine and generates spark discharge.

The engine to which the spark plug 1 is applied includes a cylinder block and a cylinder head 100. The cylinder block and the cylinder head 100 are combined to form the combustion chamber 101 therein. An air and fuel mixture flowing into the combustion chamber 101 is ignited by spark discharge generated by the spark plug 1.

In the cylinder head 100, a mount hole 110 in which the spark plug 1 is installed is formed lengthwise in a vertical direction. A lower portion of the spark plug 1, that is installed in the mount hole 110, protrudes into the combustion chamber 101. A center electrode 2 and aground electrode 3 that are electrically connected to an ignition coil are formed at the lower portion of the spark plug 1. The spark discharge is generated between the center electrode 2 and the ground electrode 3.

Figure 2:
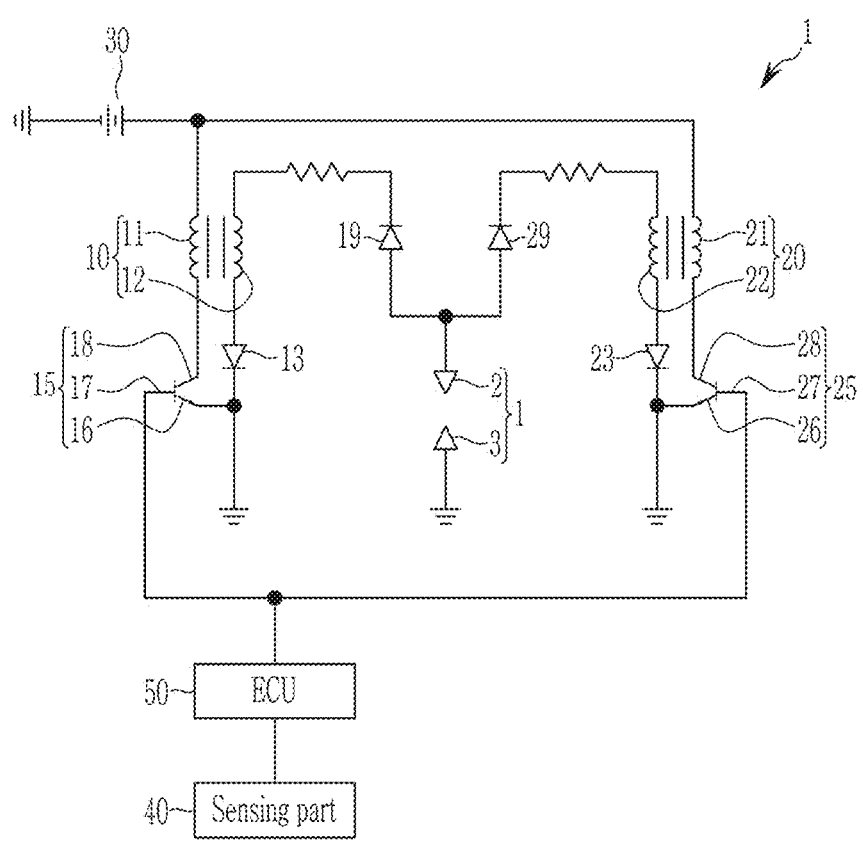
FIG. 2 illustrates a schematic view of an ignition coil control system according to an embodiment of the present disclosure.

FIG. 2 illustrates a schematic view of an ignition coil control system according to an embodiment of the present disclosure.

An ignition coil control system according to an embodiment of the present disclosure may include a plurality of ignition coils 10 and 20 having primary coils 11 and 21 and secondary coils 12 and 22, a sensing part 40 for measuring a current applied to the primary coils 11 and 21, and an ignition controller 50 for controlling an operation of the ignition coils 10 and 20.

The ignition controller 50 controls the discharge energy generated between the center electrode 2 and the ground electrode 3 through the secondary coils 12 and 22 by adjusting a duty signal based on an amount of a current applied to the primary coils 11 and 21.

To this end, the ignition controller 50 may be provided as at least one processor executed by a predetermined program. The predetermined program is configured to perform respective steps of an ignition coil control method according to an embodiment of the present disclosure.

In an embodiment of the present disclosure, the ignition coil control system may include two ignition coils 10 and 20 for respectively applying a current to the center electrode 2 and the ground electrode 3.

The first ignition coil 10 includes a primary coil 11 and a secondary coil 12. One end of the primary coil 11 is electrically connected to a battery 30 of a vehicle and the other end of the primary coil 11 is grounded through a first switch 15. According to an on/off operation of the first switch 15, the primary coil 11 of the first ignition coil 10 may be selectively electrically connected.

The first switch 15 may be implemented as an NPN transistor switch including an emitter terminal 16, a collector terminal 18, and a base terminal 17. In other words, the other end of the primary coil 11 may be electrically connected to the collector terminal 18 of the first switch 15, the emitter terminal 16 thereof may be grounded, and the base terminal 17 thereof may be electrically connected to the ignition controller 50.

One end of the secondary coil 12 is electrically connected to the center electrode 2 and the other end thereof is electrically connected to the emitter terminal 16 of the first switch 15. A diode 13 is installed between the secondary coil 12 and the emitter terminal 16 to block a current from flowing from the secondary coil 12 to the emitter terminal 16.

In addition, a diode 19 is installed between the secondary coil 12 and the center electrode 2 so that a current flows only from the secondary coil 12 to the center electrode 2.

When a duty signal is applied to the base terminal 17 of the first switch by the ignition controller 50, the primary coil 11 of the first ignition coil 10 is electrically connected and electrical energy is charged to the primary coil 11. When no duty signal is applied to the base terminal 17 of the first switch 15 by the ignition controller 50, a high voltage current (or discharge current) is generated in the secondary coil 12 due to electromagnetic induction of the primary coil 11 and the secondary coil 12. The discharge current generated in the secondary coil 12 flows to the center electrode 2. While spark discharge is generated between the center electrode 2 and the ground electrode 3 by the discharge current generated in the secondary coil 12, an air-fuel mixture inside the combustion chamber 101 is ignited.

In other words, the ignition controller 50 charges or discharges the first ignition coil 10 by turning on/off the first switch 15. When the ignition controller 50 applies a control signal (or duty signal) to the base terminal 17 of the first switch 15 (or when the switch is turned on), the primary coil 11 is charged (or the first ignition coil is charged).

In addition, when the ignition controller 50 does not apply a control signal to the base terminal 17 of the first switch 15 (or when the first switch is turned off), a high voltage current is generated in the secondary coil 12 due to electromagnetic induction with the primary coil 11 and spark discharge is generated between the center electrode 2 and the ground electrode 3 (or the first ignition coil is discharged) by the high voltage current generated in the secondary coil 12.

Like the first ignition coil 10, the second ignition coil 20 includes a primary coil 21 and a secondary coil 22. One end of the primary coil 21 is electrically connected to the battery 30 of the vehicle and the other end of the primary coil 21 is grounded through a second switch 25. According to an on/off operation of the second switch 25, the primary coil 21 of the second ignition coil may be selectively electrically connected.

The second switch 25 may be implemented as an NPN transistor switch including an emitter terminal 26, a collector terminal 28, and a base terminal 27. In other words, the other end of the primary coil 21 may be electrically connected to the collector terminal 28 of the second switch 25, the emitter terminal 26 thereof may be grounded, and the base terminal 27 thereof may be electrically connected to the ignition controller 50.

One end of the secondary coil 22 is electrically connected to the center electrode 2 and the other end thereof is electrically connected to the emitter terminal 26 of the second switch 25. A diode 23 is installed between the secondary coil 22 and the emitter terminal 26 to block a current from flowing from the secondary coil 22 to the emitter terminal 26.

In addition, a diode 23 is installed between the secondary coil 22 and the center electrode 2, so that a current flows only from the secondary coil 22 to the center electrode 2.

When a control signal is applied to the base terminal 27 of the second switch 25 by the ignition controller 50, the primary coil 21 of the second ignition coil 20 is electrically connected and electrical energy is charged to the primary coil 21. When no control signal is applied to the base terminal 27 of the second switch 25 by the ignition controller 50, a high voltage current (or discharge current) is generated in the secondary coil 22 due to electromagnetic induction of the primary coil 21 and the secondary coil 22. The discharge current generated in the secondary coil 22 flows to the center electrode 2. While spark discharge is generated between the center electrode 2 and the ground electrode 3 by the discharge current generated in the secondary coil 22, an air-fuel mixture inside the combustion chamber 101 is ignited.

In other words, the ignition controller 50 charges or discharges the second ignition coil 20 by turning the second switch 25 on/off. When the ignition controller 50 applies a control signal to the base terminal 27 of the second switch (or when the switch is turned on), the primary coil 21 is charged (or the second ignition coil is charged).

In addition, when the ignition controller 50 does not apply a control signal to the base terminal 27 of the second switch 25 (or when the second switch is turned off), a high voltage current is generated in the secondary coil 22 due to electromagnetic induction with the primary coil 21 and spark discharge is generated between the center electrode 2 and the ground electrode 3 (or the second ignition coil is discharged) by the high voltage current generated in the secondary coil 22.

In the specification of the present disclosure, charging the primary coil of the first ignition coil 10 by turning on the first switch 15 is described as charging the first ignition coil 10. A high voltage current is induced to the secondary coil of the first ignition coil 10 by turning off the first switch 15 and thus spark discharge occurs between the center electrode 2 and the ground electrode 3 is described as the first ignition coil 10 being discharged.

Likewise, charging the primary coil of the second ignition coil 20 by turning on the second switch 25 is described as charging the second ignition coil 20. A high voltage current is induced to the secondary coil of the second ignition coil 20 by turning off the second switch 25 and thus spark discharge occurs between the center electrode 2 and the ground electrode 3 is described as the second ignition coil 20 being discharged.

The sensing part 40 senses a current applied to the primary coil 11 of the first ignition coil 10 and the primary coil 21 of the second ignition coil 20 and transmits an amount of the sensed current to the ignition controller 50.

The sensing part 40 may be a current sensor that measures a current applied to the primary coil 11 of the first ignition coil 10 and the primary coil 21 of the second ignition coil 20.

Figure 3:
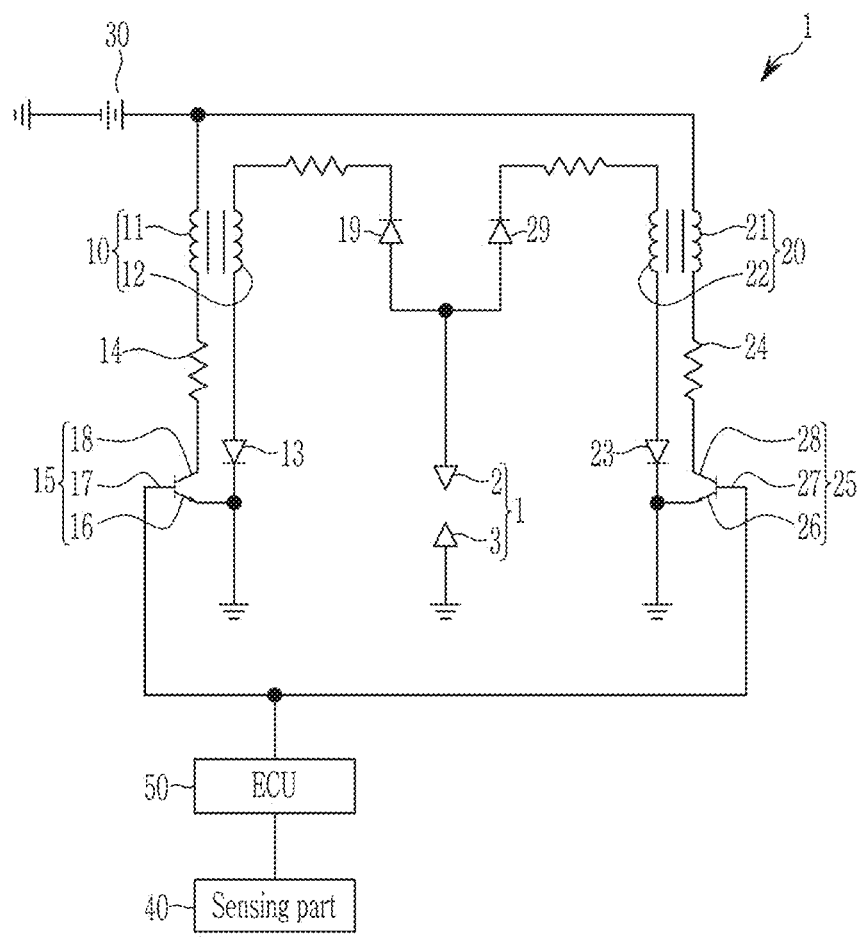
FIG. 3 illustrates a schematic view of an ignition coil control system according to another embodiment of the present disclosure.

Alternatively, the sensing part 40 may be a voltage sensor that measures a voltage applied to resistors 14 and 24 disposed between the primary coils 11 and 21 and the first switches 15 and 25 (see FIG. 3). In this case, the ignition controller 50 may calculate the current applied to the primary coils 11 and 21 by using the voltage and the resistance value transmitted from the sensing part 40.

Hereinafter, the operation of the ignition coil control system according to an embodiment of the present disclosure as described above is described in detail with reference to the accompanying drawings.

Figure 4:
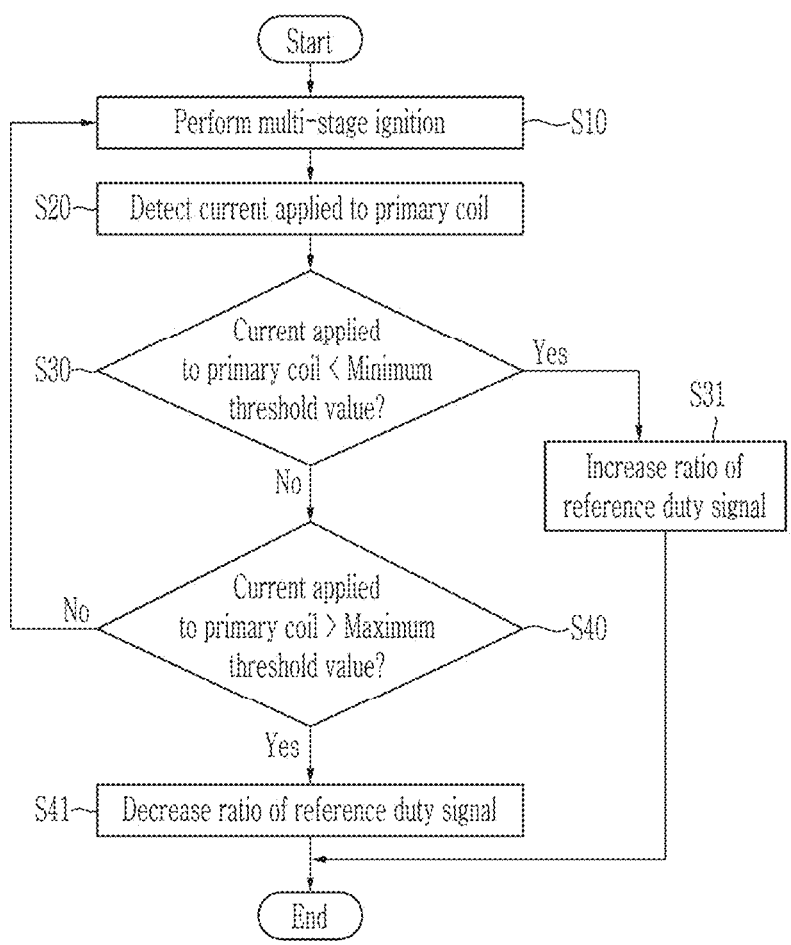
FIG. 4 illustrates a flowchart of an ignition coil control method according to an embodiment of the present disclosure.

FIG. 4 illustrates a flowchart of an ignition coil control method according to an embodiment of the present disclosure.

As shown in FIG. 4, when the engine operates, the ignition controller 50 applies a duty signal to the ignition coils 10 and 20, respectively, to charge and discharge the ignition coils 10 and 20 (S10). In other words, the ignition controller 50 respectively applies a duty signal to two ignition coils 10 and 20 to perform multi-stage ignition. In the specification of the present disclosure, the multi-stage ignition means generating a plurality of spark discharges between the center electrode 2 and the ground electrode 3 of the spark plug 10 during an explosion stroke by using the plurality of ignition coils 10 and 20.

In this case, the duty signals applied to the primary coils 11 and 21 of the ignition coils 10 and 20 may be reference duty signals. Hereinafter, the duty signal applied to the primary coil 11 of the first ignition coil 10 is referred to as a first duty signal and the duty signal applied to the primary coil 21 of the second ignition coil 20 is referred to as a second duty signal.

Figure 5:
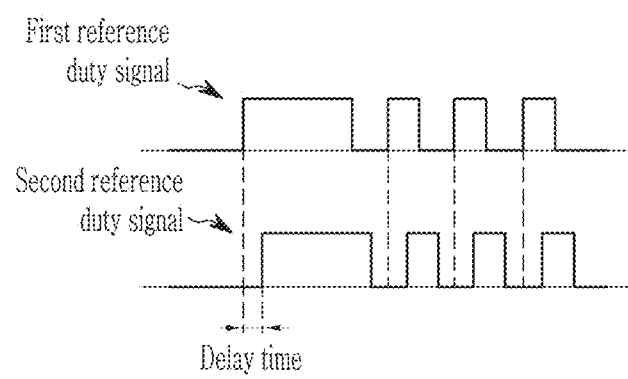
FIG. 5 illustrates a duty signal according to an embodiment of the present disclosure.

Referring to FIG. 5, the reference duty signal generated by the ignition controller 50 may include a plurality of pulse signals. Periods of the plurality of pulses or pulse signals or the ratio of the reference duty signal generated by the ignition controller 50 and including the plurality of pulse signals during the explosion stroke may be the same or different from each other.

For example, the reference duty signal may include four pulses. In this case, a period of the most preceding or first pulse (or a duration of the pulse signal) may be determined as a time when the first ignition coil 10 and the second ignition coil 20 are fully charged. In addition, periods of the remaining three pulses following the most preceding pulse may be the same. However, the scope of the present disclosure is not limited thereto and the number and the periods or ratio of the pulses of the reference duty signal may be changed as necessary.

When the reference duty signal from the ignition controller 50 is applied to the first switch 15 of the first ignition coil 10, the first switch 15 is turned on/off in synchronization with the reference duty signal and the first ignition coil 10 is charged and discharged according to the on/off of the first switch 15.

Specifically, the first ignition coil 10 is charged while the first switch 15 is turned on in synchronization with the on time of the reference duty signal. In addition, the first ignition coil 10 is discharged while the first switch 15 is turned off in synchronization with the off time of the reference duty signal.

In the same method, when the reference duty signal from the ignition controller 50 is applied to the second switch 25 of the second ignition coil 20, the second switch 25 is turned on/off in synchronization with the reference duty signal and the second ignition coil 20 is charged and discharged according to the on/off of the second switch 25.

Specifically, the second ignition coil 20 is charged while the second switch 25 is turned on in synchronization with the on time of the reference duty signal. In addition, the second ignition coil 20 is discharged while the second switch 25 is turned off in synchronization with the off time of the reference duty signal.

In the embodiment of the present disclosure, the duty signal generated by the ignition controller 50 may be applied to the first switch 15 of the first ignition coil 10 and the second switch 25 of the second ignition coil 20, respectively. In addition, the duty signal applied to the first switch 15 and the duty signal applied to the second switch 25 may be delayed for a set delay time, and the multi-stage ignition may be realized by the delay of the duty signals applied to the first switch and the second switch 25.

Referring back to FIG. 4, the sensing part 40 detects the current applied to the primary coils 11 and 21 of the ignition coils 10 and 20 and transmits the detected current value of the primary coils 11 and 21 to the ignition controller 50 (S20).

When the current applied to the primary coils 11 and 21 of the ignition coils 10 and 20 transmitted from the sensing part 40 is less than a minimum threshold value (S30), the ignition controller 50 increases a ratio of the reference duty signal (S31). In other words, the ignition controller 50 increases the period of the pulses configuring the reference duty signal (see FIG. 5).

When the current applied to the primary coils 11 and 21 of the ignition coils 10 and 20 is smaller than the minimum threshold value, it means a state in which the flow in the combustion chamber 101 is relatively fast or strong or the pressure in the combustion chamber 101 is high. In this case, since the discharge energy generated between the center electrode 2 and the ground electrode 3 is rapidly consumed, discharging occurs in a state in which sufficient energy (or current) in the secondary coils 12 and 22 of the ignition coils 10 and is not charged. Accordingly, discharging occurs in a state in which sufficient energy (or current) in the primary coils 11 and 2 of the ignition coils 10 and 20 is not charged.

To solve this problem, when the current applied to the primary coils 11 and 21 is less than the minimum threshold value, by increasing the ratio of the reference duty signal, sufficient energy (or current) is charged and then discharged in the primary coils 11 and 21 of the ignition coils 10 and 20.

Through this, the current applied to the primary coils 11 and 21 is maintained at an appropriate level between the maximum threshold value and the minimum threshold value, and the discharge energy discharged between the center electrode 2 and the ground electrode 3 is also maintained at an appropriate level by the secondary coils 12 and 22.

Figure 6:
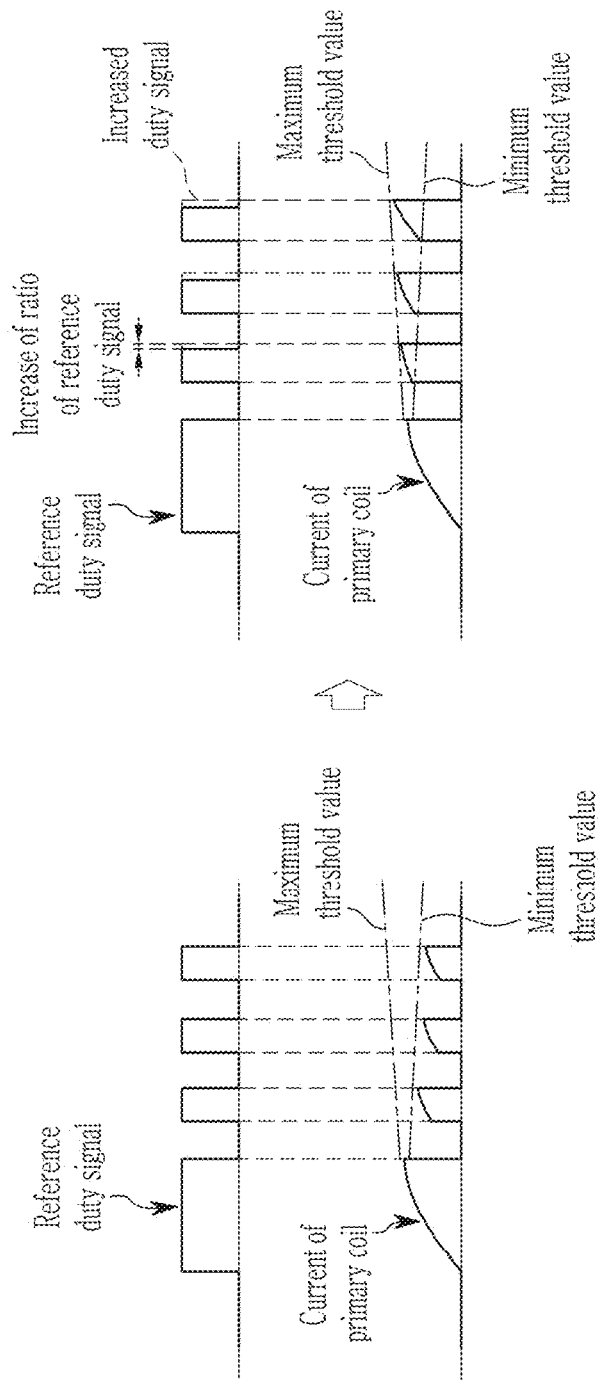
FIG. 6 and FIG. 7 are drawings for explaining a control operation of an ignition coil according to an embodiment of the present disclosure.
Figure 7:
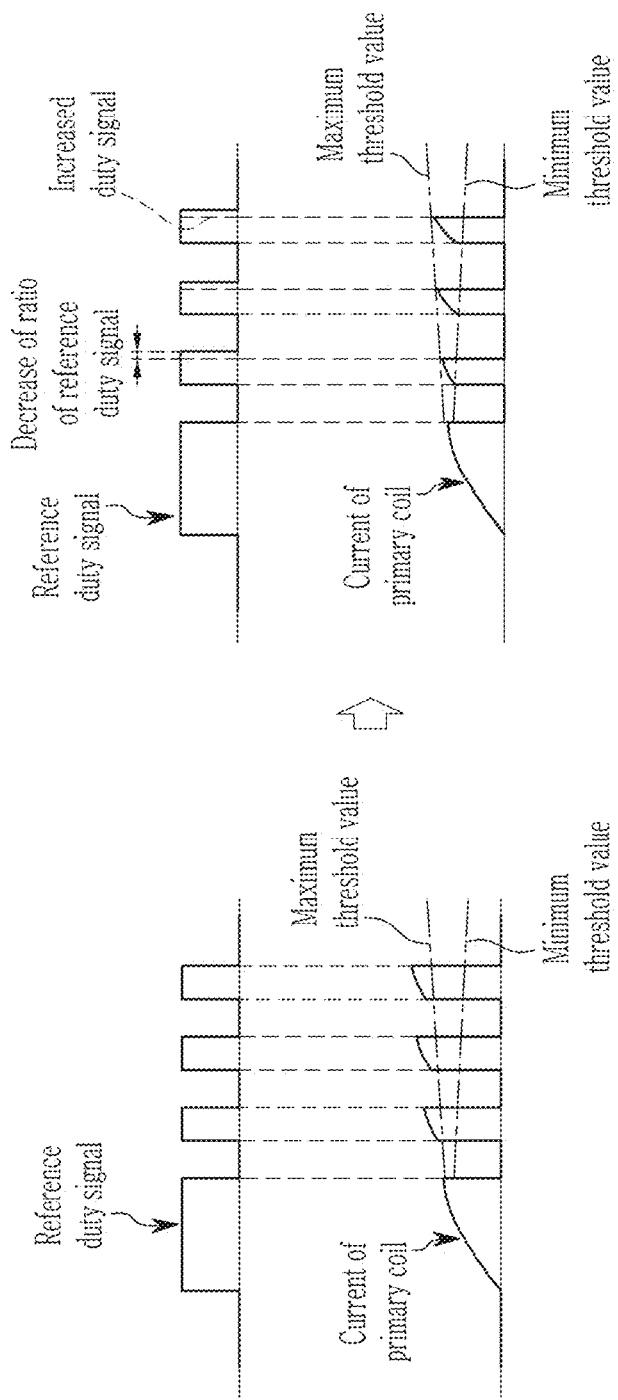

When the current applied to the primary coils 11 and 21 of the ignition coils 10 and 20 transmitted from the sensing part 40 exceeds the maximum threshold value (S40), the ignition controller 50 decreases the ratio of the reference duty signal (S41). In other words, the period of the pulses configuring the reference duty signal is decreased (see FIG. 6).

When the current applied to the primary coils 11 and 21 of the ignition coils 10 and 20 is larger than the maximum threshold value, it means a state in which the flow in the combustion chamber 101 is relatively slow or weak or the pressure in the combustion chamber 101 is low. In this case, since the discharge energy generated between the center electrode 2 and the ground electrode 3 is slowly consumed, excessive energy (or current) is charged in the secondary coils 12 and 22 of the ignition coils 10 and 20. Accordingly, excessive energy (or current) is also charged in the primary coils 11 and 21 of the ignition coils 10 and 20.

To solve this problem, when the current applied to the primary coils 11 and 21 of the ignition coils 10 and 20 exceeds the maximum threshold value, by decreasing the ratio of the reference duty signal, it is possible to prevent the excessive energy (or current) from being charged in the primary coils 11 and 21 of the ignition coils 10 and 20.

Through this, the current applied to the primary coils 11 and 21 is maintained at an appropriate level between the maximum threshold value and the minimum threshold value, and the discharge energy discharged between the center electrode 2 and the ground electrode 3 is also maintained at an appropriate level by the secondary coils 12 and 22.

In order to determine a situation in which excessive energy is charged or sufficient energy is not charged in the secondary coils 12 and 22 of the ignition coils 10 and 20 according to the flow or pressure state inside the combustion chamber 101, a more accurate result may be obtained by measuring the current applied to the secondary coils 12 and 22 of the ignition coils 10 and 20. However, the current applied to the secondary coils 12 and 22 of the ignition coils 10 and is relatively very low (approximately a peak value of 200 mA), and the voltage applied to the secondary coils 12 and 22 of the ignition coils 10 and 20 is relatively very high (about 2 to 3 KV). Therefore, in order to measure the current or voltage applied to the secondary coils 12 and 22 of the ignition coils 10 and 20, very expensive equipment is required. Accordingly, the present disclosure predicts the current applied to the secondary coils 12 and 22 of the ignition coils 10 and 20 from the current applied to the primary coils 11 and 21 of the ignition coils 10 and 20. Thus, it is possible to predict the flow or pressure state inside the combustion chamber 101 through relatively inexpensive equipment to supply appropriate ignition energy into the combustion chamber 101.

In addition, when the multi-stage ignition is performed by using the plurality of ignition coils, since the spark discharge is continuously generated between the center electrode and the ground electrode, the ignition energy may be efficiently supplied into the mixed air in the combustion chamber. As described above, by adjusting the ratio of the reference duty signal based on the current applied to the primary coil of the ignition coil while performing the multi-stage ignition, it is possible to supply an appropriate level of discharge energy into the combustion chamber and to secure durability of the ignition coil.

While the inventive concept of this disclosure has been described in connection with what are presently considered to be practical embodiments, it is to be understood that the inventive concept is not limited to the disclosed embodiments. On the contrary, the disclosure is intended to cover various modifications and equivalent arrangements included within the spirit and scope of the appended claims.

DESCRIPTION OF SYMBOLS

1: spark plug
2: center electrode
3: ground electrode
10: first ignition coil
11: primary coil
12: secondary coil
13: diode
15: first switch
16: emitter terminal
17: base terminal
18: collector terminal
19: diode
20: second ignition coil
21: primary coil
22: secondary coil
23: diode
25: second switch
26: emitter terminal
27: base terminal
28: collector terminal
29: diode
30: battery
40: sensing part
50: ignition controller
100: cylinder head
101: combustion chamber
110: mount hole

What is claimed is:

1. An ignition coil control system, comprising:
a plurality of ignition coils that respectively include a primary coil and a secondary coil;
a spark plug that generates a spark discharge by a discharge current generated by the plurality of ignition coils and includes a center electrode and a ground electrode;
a sensing part measuring a current applied to the primary coil; and
an ignition controller that adjusts a reference duty signal based on an amount of the current applied to the primary coil sensed by the sensing part to adjust discharge energy generated between the center electrode and the ground electrode through the secondary coil.

2. The ignition coil control system of claim 1, wherein the ignition controller decreases a ratio of the reference duty signal when the current applied to the primary coil exceeds a maximum threshold value.

3. The ignition coil control system of claim 1, wherein the ignition controller increases a ratio of the reference duty signal when the current applied to the primary coil is less than a minimum threshold value.

4. The ignition coil control system of claim 1, wherein the sensing part directly measures the current applied to the primary coil.

5. The ignition coil control system of claim 1, wherein the sensing part calculates the current of the primary coil through a resistance value of a resistor electrically connected in series to the primary coil and a voltage applied to the resistor.

6. The ignition coil control system of claim 1, wherein the plurality of ignition coils is two ignition coils that respectively supply a current to the center electrode and the ground electrode, and
the ignition controller applies the reference duty signal to each of the primary coils of the two ignition coils to perform multi-stage ignition.

7. The ignition coil control system of claim 6, wherein the reference duty signal applied to each of the primary coils of the two ignition coils is delayed for a set delay time.

8. An ignition coil control method in which a spark plug is included that generates spark discharge by a discharge current generated by a plurality of ignition coils, respectively including a primary coil and a secondary coil, and that includes a center electrode and a ground electrode, the ignition coil control method comprising:
measuring a current applied to the primary coil; and
adjusting a reference duty signal based on an amount of the current applied to the primary coil to adjust discharge energy generated between the center electrode and the ground electrode through the secondary coil.

9. The ignition coil control method of claim 8, wherein when the current applied to the primary coil exceeds a maximum threshold value, a ratio of the reference duty signal is decreased.

10. The ignition coil control method of claim 8, wherein when the current applied to the primary coil is less than a minimum threshold value, a ratio of the reference duty signal is increased.

11. The ignition coil control method of claim 8, wherein the plurality of ignition coils is two ignition coils that respectively supply a current to the center electrode and the ground electrode, and
the ignition controller applies the reference duty signal to each of the primary coils of the two ignition coils to perform multi-stage ignition.

12. The ignition coil control method of claim 11, wherein the reference duty signal applied to each of the primary coils of the two ignition coils is delayed for a set delay time.

* * * * *